United States Patent [19]

Kruer

[11] Patent Number: 5,062,899
[45] Date of Patent: Nov. 5, 1991

[54] WIDE ACCEPTANCE ANGLE, HIGH CONCENTRATION RATIO, OPTICAL COLLECTOR

[75] Inventor: Mark A. Kruer, Redondo Beach, Calif.

[73] Assignee: The United States of America as represented by the Administrator of the National Aeronautics and Space Administration, Washington, D.C.

[21] Appl. No.: 503,408

[22] Filed: Mar. 30, 1990

[51] Int. Cl.$^5$ .................... H01L 31/052; F24J 2/18
[52] U.S. Cl. .................... 136/259; 136/246; 126/439; 359/853; 359/859
[58] Field of Search .................... 136/246, 248, 259; 126/439; 350/620

[56] References Cited

U.S. PATENT DOCUMENTS 4,131,485  12/1978  Meinel et al. .................... 136/259

Primary Examiner—Aaron Weisstuch
Attorney, Agent, or Firm—Robert L. Broad, Jr.; Jerry L. Seemann

[57] ABSTRACT

A cassegrain optical system provides improved collection of off-axis light yet is still characterized by a high concentration ratio. The optical system includes a primary mirror for collecting incoming light and reflecting the light to a secondary mirror which, in turn, reflects the light to a solar cell or other radiation collection device. The primary mirror reflects incoming on-axis light onto an annular section of the secondary mirror and results in the reflection of a substantial amount of incoming off-axis light onto the remainder of the secondary mirror. Thus light which would otherwise be lost to the system will be captured by the collector. Furthermore, the off-axis sections of the secondary mirror may be of a different geometrical shape than the on-axis annular section so as to optimize the amount of off-axis light collected.

7 Claims, 3 Drawing Sheets

WIDE ACCEPTANCE ANGLE, HIGH CONCENTRATION RATIO, OPTICAL COLLECTOR

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

FIELD OF THE INVENTION

This invention relates generally to radiation collecting systems and more particularly to solar collectors of the cassegrain design requiring a wide acceptance angle and a high concentration ratio.

DESCRIPTION OF THE PRIOR ART

The cassegrain system is one of the most widely used designs for optical systems, such as telescopes, telephoto lenses, and solar collectors. A standard cassegrain system comprises two mirrors, a primary mirror and a secondary mirror, which are aligned coaxially. The primary mirror captures and reflects incoming light to the generally smaller, secondary mirror. The secondary mirror in turn reflects the light to the system optical focus where a solar cell, camera, or any other radiation collecting apparatus may be located. Typically the primary mirror is a parabolic surface and the secondary mirror is a hyperbolic surface. The exact shapes of the hyperbola and the parabola are calculated to optimize the system efficiency. The chief advantage of the cassegrain design is that a physically small cassegrain optical system can yield a relatively long focal length.

System efficiency is critical to most optical systems and to solar collectors in particular. In considering system efficiency, one of the most important parameters of an optical system is the concentration ratio. The concentration ratio is a measure of the capability of a optical system to capture and focus a relatively large amount of light onto a relatively small area. Thus a system having a high concentration ratio is able to focus the energy captured by a large primary mirror onto a small solar cell. The concentration ratio is particularly important in solar collectors as the energy output of the system is dependent thereon.

Another factor affecting efficiency is the system acceptance angle. The acceptance angle is a measure of the capability of the system to capture light entering the system off-axis. Typically, light entering the system at an angle of more than a few degrees off-axis will be lost by the system. Consequently, an optical system having a narrow acceptance angle must be precisely targeted and, therefore, must include sophisticated tracking equipment.

The efficiency of a cassegrain system may also be degraded due to misalignment. If the secondary mirror is not properly aligned with the primary mirror, light entering the system on-axis is reflected by the secondary mirror to some point other than the system focus and therefore is lost to the system.

Finally, even in a properly aligned system, a percentage of the light entering the system on-axis is lost due to the effects of non-specular reflection. Manufactured mirrors do not provide fully specular reflectance characteristics. Consequently, the primary mirror reflects a light ray into a cone rather than into another discrete ray. Unless the system is designed to compensate for non-specular reflection, more light will be lost.

Thus, an efficient optical system must have a wide acceptance angle, must have a high concentration ratio, must be capable of operating efficiently despite misalignment, and must compensate for the effects of non-specular reflection. Conventional prior art devices do not adequately satisfy these criteria.

Typical examples of the prior art include the following patents: U.S. Pat. No. 4,286,581 (Atkinson); U.S. Pat. No. 4,068,474 (Dimitroff); U.S. Pat. No. 4,723,535 (Lew); and U.S. Pat. No. 3,947,824 (Smith).

Briefly considering these patents, the Atkinson patent discloses a cassegrain solar collector having a black body absorption cavity for receiving solar radiation. A sophisticated system is provided for maintaining the orientation of the system parallel to the incident radiation. The Dimitroff patent also discloses a cassegrain optical collector. The Lew patent discloses a non-cassegrain cylindrical solar collector having V-shaped light funnels which is said to be relatively immune to defects in positioning. The Smith patent discloses a non-cassegrain cylindrical solar energy collector. The collector utilizes a cylindrical reflector with a spiral mirror structure and is said to be relatively immune to defects in positioning.

Cylindrical mirror designs such as those disclosed in the Lew and Smith patents are not capable of providing the high concentration ratios available in cassegrain systems. On the other hand, typical cassegrain systems, as exemplified by the Atkinson and Dimitroff patents, are not capable of capturing substantial off-axis light nor of tolerating misalignment. Thus as discussed above, the optical collectors of the prior art do not provide for both high concentration ratios and high acceptance angles.

SUMMARY OF THE INVENTION

It is the primary object of the present invention to provide a solar collector having both a high concentration ratio and a wide acceptance angle.

It is a further object of this invention to provide a cassegrain solar collector which is capable of tolerating a small amount of misalignment.

It a still further object of the present invention to provide a cassegrain solar collector that captures a greater amount of off-axis light than the prior art cassegrain collectors.

These and other objects are achieved, and the disadvantages of the prior art are overcome, by an optical collector constructed in accordance with the present invention which comprises a cassegrain system wherein light entering the system on-axis is reflected to an annular section of the secondary mirror.

In general terms, the present invention concerns a radiation collector capable of improved collection of off-axis radiation at high concentration ratios and comprising a generally concave primary mirror, a means for collecting radiation, and a secondary mirror aligned coaxially with the primary mirror for reflecting radiation received from the primary mirror to the radiation entering on-axis to an annular section of the secondary mirror and reflects radiation entering off-axis to the remainder the secondary mirror. Thus radiation which would otherwise be lost due to the effects of non-specular reflection strikes the off-axis sections of the secondary mirror and is reflected to the radiation collector means. Further, as a consequence of the construction thereof, the system is relatively immune to defects in alignment. In various alternate embodiments, the off-axis sections of the secondary mirror are optimized to reflect the greatest possible amount of off-axis radiation.

Other objects, features, and advantages of the invention will be set forth in, or be apparent from, the detailed description of the preferred embodiments of the invention which follows.

DETAILED DESCRIPTION OF THE PREFERRED EMBODIMENTS

Figure 2:
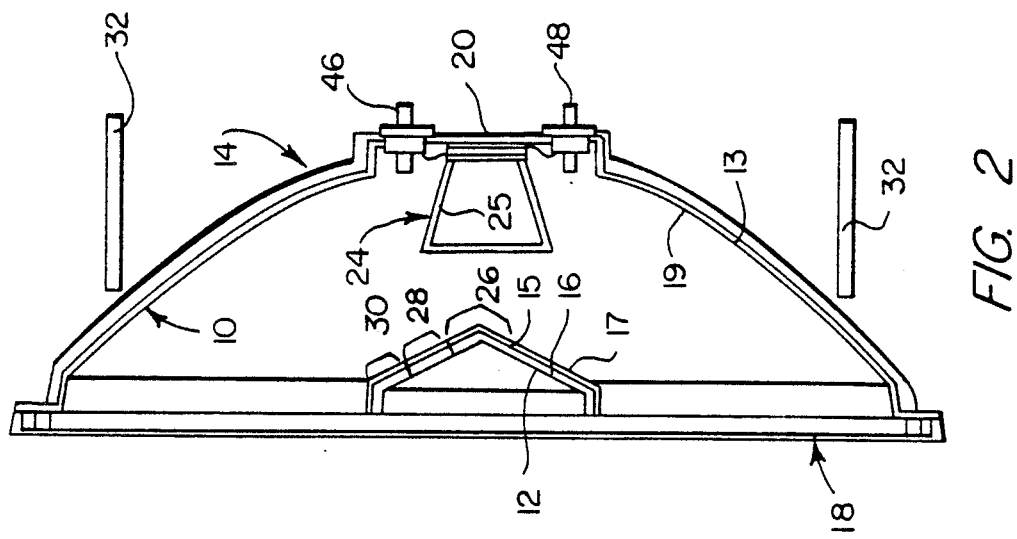
FIG. 2 is a cross-sectional view taken generally along line A—A of FIG. 1.
Figure 1:
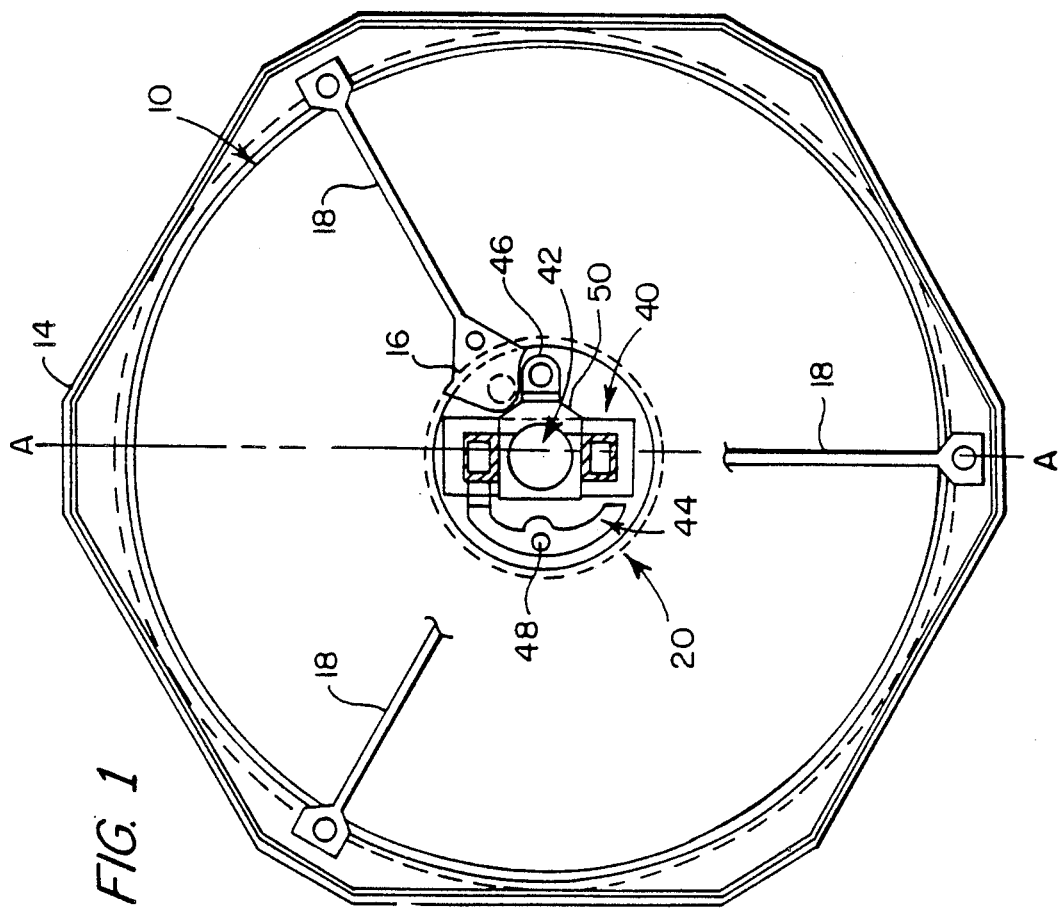
FIG. 1 is a top plan view of a preferred embodiment of the present invention.

Referring to FIGS. 1 and 2, a prefered embodiment of the present invention is shown. The optical collector illustrated in FIGS. 1 and 2 includes a concave primary mirror 10 and a convex secondary mirror 12. The primary mirror 10 includes a circular hole or unencumbered mounting position located at its center wherein a solar collector 20 is located.

The convex outer surface 13 of primary mirror 10 is supported by a primary mirror support 14 or may be self supporting. The rear surface 15 of secondary mirror 12 is attached to secondary mirror support 16 or may be self supporting. Secondary mirror 12 and secondary mirror support 16 are suspended near the focus of primary mirror 10 via three spider supports 18 and oriented such that the mirrored convex surface 17 of the secondary mirror 12 faces mirrored concave inner surface 19 of the primary mirror 10. Each spider support 18 is attached at one end to the outer periphery of primary mirror support 14 and at the other end to the outer periphery of secondary mirror support 16. Primary mirror support 14, secondary mirror support 16, and spider supports 18 must be constructed of material capable of supporting the weight of all elements thus far described.

Solar collector 20 includes a mounting pad 40 upon which a solar cell 42 is mounted. Solar cell 42 is interconnected by interconnect members 44 and 50 and the output of solar cell 42 is fed through feed through terminals 46 and 48 to any suitable energy collecting device such as a battery (not shown).

Solar collector 20, as mentioned above, is positioned at the center of primary mirror 10, and is attached to primary mirror support 14. A substantially conic mirror 24 having a mirrored interior surface 25 is aligned along the system axis and surrounds solar collector 20. Conic mirror 24 is truncated at both ends and oriented with the wider of the two ends facing towards secondary mirror 12 and with the narrower of the two ends surrounding solar collector 20. The interior angle of conic mirror 24 is chosen so as to allow conic mirror 24 to reflect errant light directed toward the vicinity of solar collector 20.

Figure 3:
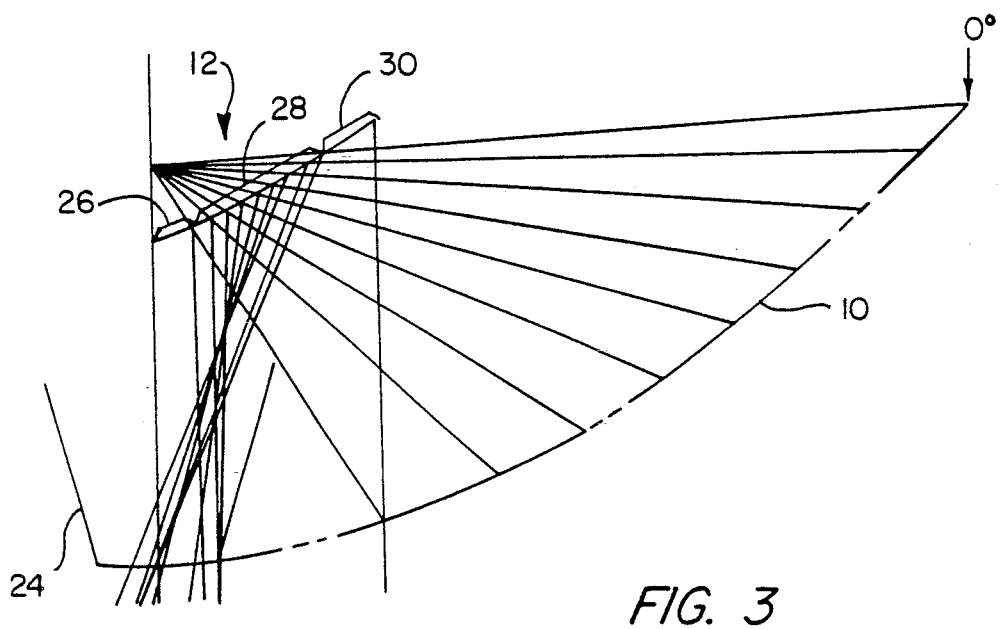
FIG. 3 is a schematic representation of a porton of the reflection pattern of on-axis light rays onto an annular section of the secondary mirror.

Mirrored surface 17 of secondary mirror 12 has three distinct zones: a center circle for off axis collection indicated in FIG. 2 at 26, an on-axis annulus indicated at 28, and an off-axis section indicated at 30. The shape of primary mirror 10 is chosen so that primary mirror 10 will reflect light entering the system on-axis onto the on-axis annulus 28 of secondary mirror 12 as indicated in FIG. 3. Thus, primary mirror 10 is no longer describable merely by conic equations and may be partially or completely non-conic. In a preferred embodiment, primary mirror 10 is parabolic. As a result of the shape of primary mirror 10, a substantial amount of light entering the system off-axis will be reflected by primary mirror 10 onto either off-axis section 30 or onto center circle 26 of secondary mirror 12. Subsequently, these off-axis sections 26, 30 will reflect the off-axis light toward solar collector 20. Also, even when primary mirror 10 and secondary mirror 12 are misaligned, a substantial amount of the light that would otherwise be lost in prior art systems will be reflected onto either center circle 26 or off-axis section 30. Thus, the present invention has a wider acceptance angle than prior art cassegrain solar collectors.

Secondary mirror 12, unlike standard cassegrainian optical assemblies, no longer only uses conical equations for mirror surface description. Rather, in the preferred embodiment, center circle 26 and off-axis section 30 are compound paraboloids and on-axis annulus 28 is an hyperboloid. Other configurations may be used as long as secondary mirror 12 is designed to reflect radiation impinging onto solar collector 20. The preferred acceptance angle for the system is 3°.

The entire optical system thus far described is supported and targeted by a supporting assembly indicated schematically at 32. For terrestrial solar collection purposes, the supporting assembly 32 must be capable of tracking the diurnal motions of the sun with reasonable precision. However, by virtue of its wide acceptance angle, the present invention does not require the precise targeting that is needed by prior art cassegrain optical collectors. Consequently, the present invention will operate effectively with a relatively inexpensive tracking system. Furthermore, less sophisticated tracking systems are typically more reliable, and hence, a cassegrain solar collector in accordance with the present invention may suffer less down time.

Another advantage of the present invention is its enhanced ability to capture light that is lost by prior art systems due to the effects of specular reflection. As noted above, manufactured mirrors are not fully specular in reflectance characteristics and, therefore, a manufactured mirror reflects an incoming light ray into a cone rather than a discrete ray. However, in the present invention, that portion of the cone that would be lost to a prior art system will strike the off-axis section 30 of the cassegrain system of the present invention and be reflected toward the solar collector 20. Thus, the present invention compensates for the effects of non-specular reflection.

Figure 4:
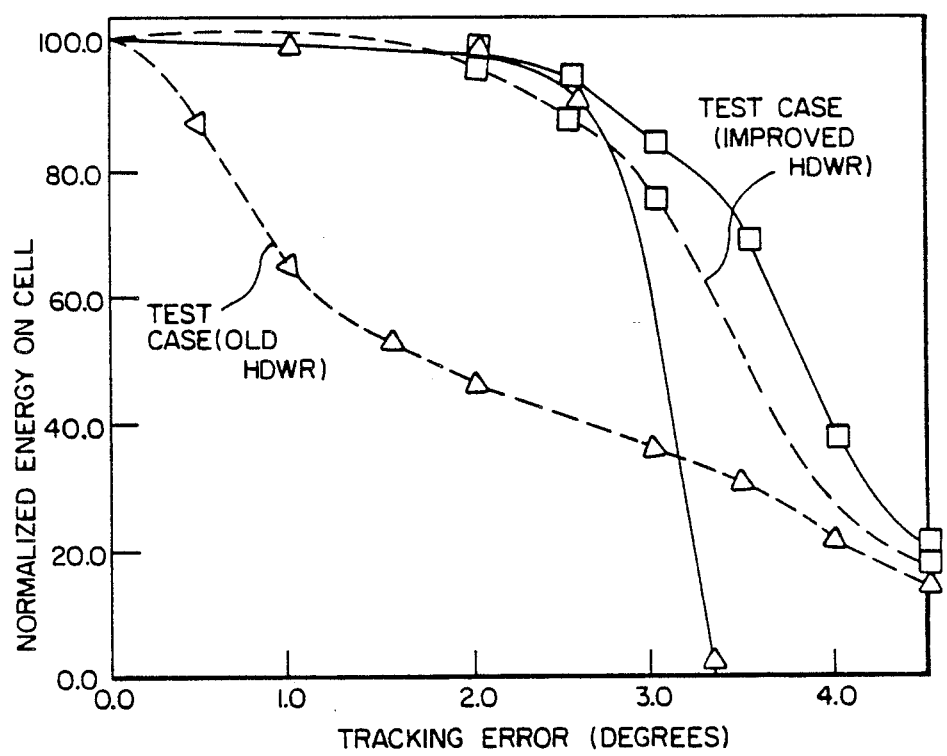
FIG. 4 is a graph showing the normalized amount of energy striking the solar cell of the preferred embodiment of the present invention.

A cassegrain solar collector constructed in accordance with the preferred embodiment of the present invention has a wide acceptance angle, a high concentation ratio, operates efficiently despite misalignment, and compensates for the effects of non-specular reflection. These advantages of the present invention are depicted by the graph in FIG. 4 which compares system efficiency as a function of tracking error between the present invention and a prior art cassegrain solar collector. Solid lines marked with squares show the normalized energy striking the solar cell as a function of the tracking error for the preferred embodiment of the present invention. The solid line marked by triangles shows the same information for a prior art cassegrain solar collector. The dashed lines show energy received by the collector cell versus tracking error for the same systems which are however, in this case, misaligned. As can be seen from FIG. 4, a device constructed according to the present invention captures more energy entering the system off-axis than does the prior art solar collector. Also, a device in accordance with the present invention tolerates defects in alignment better than the prior art solar collector.

Figure 5:
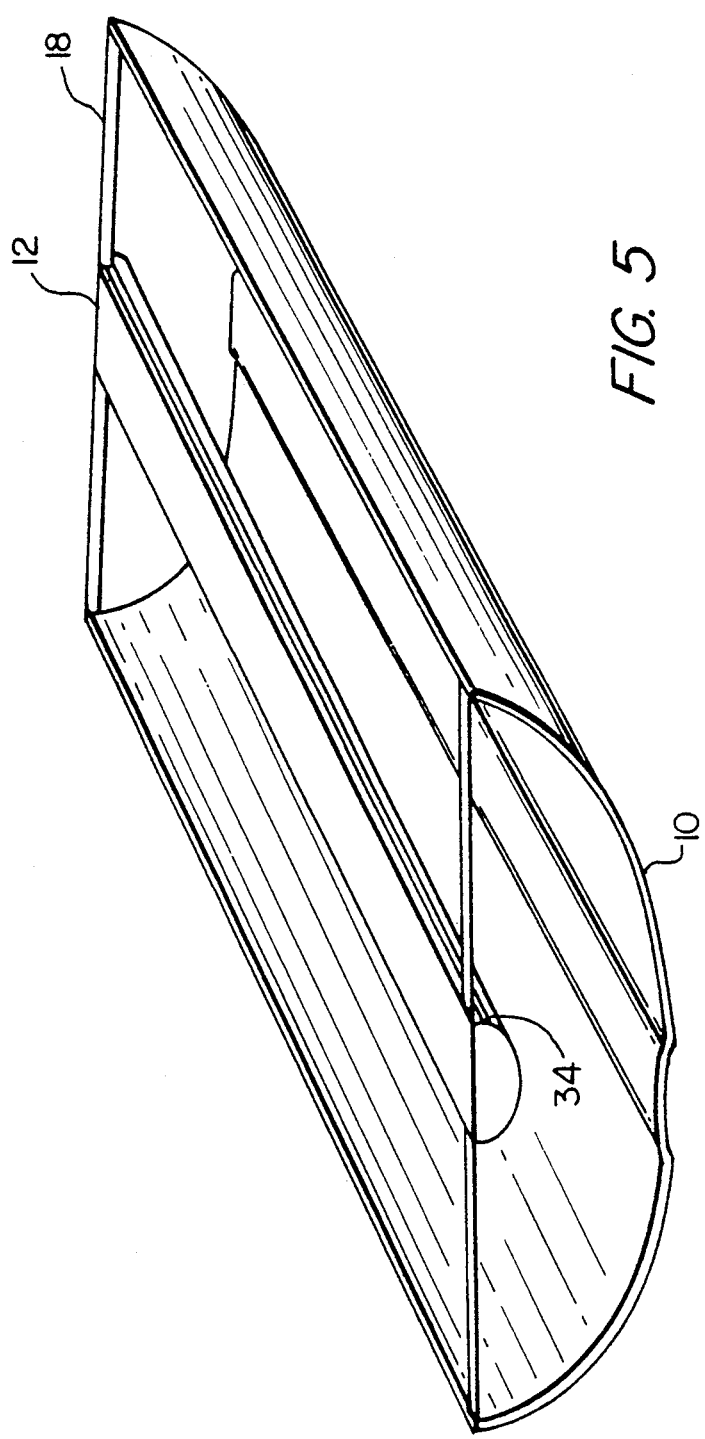
FIG. 5 is a perspective view of an alternate embodiment of the present invention wherein the mirror cross sections are cylindrical.

Thus far an embodiment of the present invention wherein the mirror elements have three-dimensional curvature has been described. However, the innovations of the present invention may be applied to any cassegrain system. The benefits of the present invention will be realized in any cassegrain system where the reflection from the primary mirror is directed toward an interior section of the secondary mirror and the remaining sections of the secondary mirror are optimized to redirect off-axis light toward the solar collector. FIG. 5 depicts an alternate embodiment of the present invention wherein the mirror cross-sections are cylindrical. In this embodiment, primary mirror 10 reflects on-axis light onto stripe sections 34 on the secondary mirror 12. The remaining sections of the secondary mirror may be of a different shape than the on-axis section 34 so to optimize the amount of off-axis light captured by the system.

Although the invention has been described with respect to exemplary embodiments thereof, it will be understood by those skilled in the art that variations and modifications can be effected in these embodiments without departing from the scope or spirit of the invention.

I claim:

1. A radiation collector capable of improved collection of off-axis radiation at high concentration ratios, said collector comprising:
   a generally concave primary mirror for receiving and reflecting radiation;
   means for collecting radiation reflected by said primary mirror;
   a secondary mirror aligned coaxially with, and spaced in relation to, said primary mirror for redirecting radiation received from said primary mirror to said radiation collecting means, said secondary mirror having an inner zone, a central zone and an outer zone, said central zone having a hyperboloidal cross sectional configuration which reflects on-axis radiation from the primary mirror to the collecting means, and said inner and outer zones having paraboloidal cross sectional configurations which reflect off-axis radiation from the primary mirror to the collecting means.

2. The apparatus of claim 1, wherein said secondary primary and mirrors are both described by a surface of rotation.

3. The apparatus in claim 1, wherein said radiation collecting means comprises a collector for collecting visible light.

4. The apparatus in claim 1, wherein said radiation collecting means comprises a radiation collector for collecting infrared radiation.

5. The apparatus of claim 1 wherein said radiation collecting means is aligned coaxially with said primary mirror and said secondary mirror.

6. The apparatus of claim 5, wherein said radiation collecting means is located at the center of said primary mirror.

7. The apparatus of claim 1, wherein the section of said secondary mirror receiving on-axis light is substantially annular.

* * * * *